(12) United States Patent
Honrao et al.

(10) Patent No.: US 12,389,559 B2
(45) Date of Patent: Aug. 12, 2025

(54) HOUSING ASSEMBLY HAVING BREAKAWAY LEG MEMBERS

(71) Applicant: ZF Friedrichshafen AG, Friedrichshafen (DE)

(72) Inventors: Tushar Honrao, Farmington Hills, MI (US); David Germany, Southfield, MI (US); Anjani Kumar, Northville, MI (US); Manojkumar Subhash Sonawane, Pune (IN)

(73) Assignee: ZF Friedrichshafen AG, Friedrichshafen (DE)

( * ) Notice: Subject to any disclaimer, the term of this patent is extended or adjusted under 35 U.S.C. 154(b) by 0 days.

(21) Appl. No.: 17/991,046

(22) Filed: Nov. 21, 2022

(65) Prior Publication Data

US 2024/0172378 A1    May 23, 2024

(51) Int. Cl.
| | |
|---|---|
| *H05K 5/02* | (2006.01) |
| *H05K 5/00* | (2006.01) |
| *H05K 5/04* | (2006.01) |

(52) U.S. Cl.
CPC ......... *H05K 5/0234* (2013.01); *H05K 5/0026* (2013.01); *H05K 5/04* (2013.01)

(58) Field of Classification Search
None
See application file for complete search history.

(56) References Cited

U.S. PATENT DOCUMENTS

| | | | |
|---|---|---|---|
| 11,026,340 B2 * | 6/2021 | Bessho | B60R 16/0239 |
| 2015/0282362 A1 * | 10/2015 | Nuriya | H05K 5/0056 361/728 |
| 2022/0295656 A1 * | 9/2022 | Uchida | H05K 5/0221 |

* cited by examiner

*Primary Examiner* — James Wu
*Assistant Examiner* — Christopher L Augustin
(74) *Attorney, Agent, or Firm* — Kristin L. Murphy

(57) ABSTRACT

A housing assembly can include a housing structure and a plurality of leg members. At least one leg member of the plurality of leg members comprises a foot portion and at least one connecting portion. Each leg member can define a first convex portion disposed between the foot portion and the at least one connecting portion and a second convex portion disposed between the first convex portion. A radius of the first convex portion is about two times greater than a radius of the second convex portion.

20 Claims, 3 Drawing Sheets

HOUSING ASSEMBLY HAVING BREAKAWAY LEG MEMBERS

The present disclosure relates to a housing assembly having leg members for protecting an electronic control unit (ECU).

ECUs are control units that can be installed behind the dashboard or in between driver and passenger seats of the vehicle. The ECU typically controls the function of the vehicle such as airbags by controlling a series of actuators based on input from crash sensors.

SUMMARY

A housing assembly can include a housing structure and a plurality of leg members. At least one leg member of the plurality of leg members comprises a foot portion and at least one connecting portion. Each leg member can define a first convex portion disposed between the foot portion and the at least one connecting portion and a second convex portion disposed between the first convex portion. A radius of the first convex portion is about two times greater than a radius of the second convex portion.

In another exemplary arrangement, the housing assembly includes a first concave portion proximal to an interface of the at least one connecting portion and a side surface of the housing structure, wherein a radius ratio of the first convex portion to second convex portion to the concave portion comprises 1:0.5:1.

In another exemplary arrangement, the housing assembly includes a second concave portion, wherein an angle between the first concave portion and the second concave portion comprises about twenty degrees.

In another exemplary arrangement, the radius of the first convex portion comprises about one millimeter.

In another exemplary arrangement, at least one leg member is configured to separate from the housing structure when a predetermined static load force is exerted on the housing assembly.

In another exemplary arrangement, the housing assembly includes an electronic control unit, wherein the housing structure is configured to retain the electronic control unit.

In another exemplary arrangement, the housing assembly includes an electrical connector that is configured to provide an electrical connection to the electronic control unit.

In another exemplary arrangement, the housing assembly includes an overhang that extends outwardly from an upper surface of the housing structure.

In another exemplary arrangement, the overhang is integral with the housing structure.

In another exemplary arrangement, the housing structure comprises die cast metal.

In another exemplary arrangement, the die cast metal comprises aluminum.

A housing assembly can include a housing structure and an electronic control unit disposed within the housing structure. The housing assembly also includes a plurality of leg members. Each leg member of the plurality of leg members comprises a foot portion and a plurality of connecting portions. Each leg member can define a first convex portion disposed between the foot portion and a connecting portion of the plurality of connecting portions and a second convex portion disposed between the first convex portion. A radius of the first convex portion is about two times greater than a radius of the second convex portion.

In another exemplary arrangement, the housing assembly includes a first concave portion proximal to an interface of the connecting portion and a side surface of the housing structure, wherein a radius ratio of the first convex portion to second convex portion to the concave portion comprises 1:0.5:1.

In another exemplary arrangement, the housing assembly includes a second concave portion, wherein an angle between the first concave portion and the second concave portion comprises about twenty degrees.

In another exemplary arrangement, the radius of the first convex portion comprises about one millimeter.

In another exemplary arrangement, at least one leg member is configured to separate from the housing structure when a predetermined static load force is exerted on the housing assembly.

In another exemplary arrangement, the housing assembly includes an electrical connector that is configured to provide an electrical connection to the electronic control unit.

In another exemplary arrangement, the housing assembly includes an overhang that extends outwardly from an upper surface of the housing structure.

In another exemplary arrangement, the overhang is integral with the housing structure.

In another exemplary arrangement, the housing structure comprises die cast metal.

In another exemplary arrangement, the stamped metal comprises of die cast aluminum.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
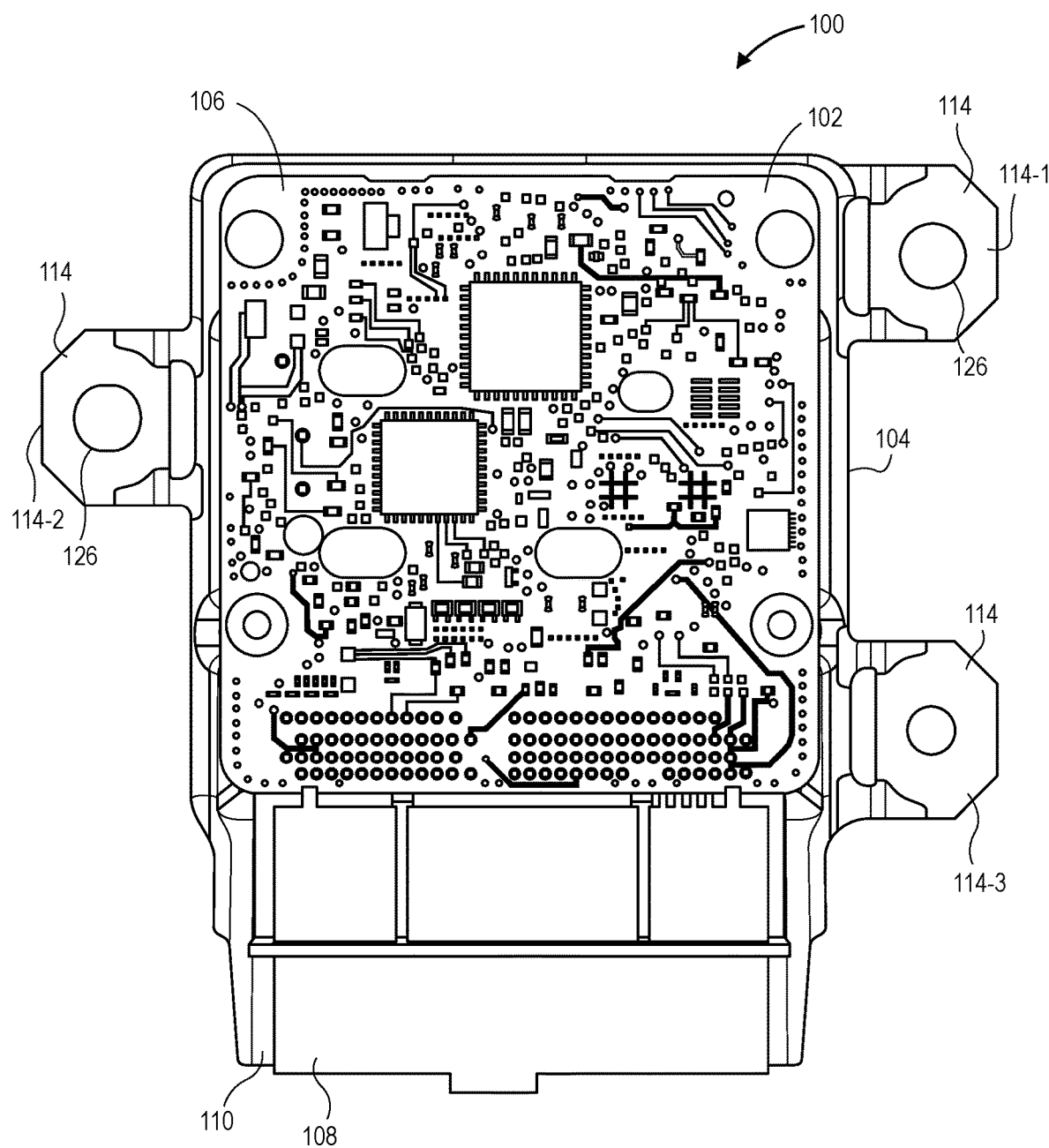
FIG. 1 is a bottom view of a housing assembly that includes a housing structure retaining an electronic control unit.
Figure 2:
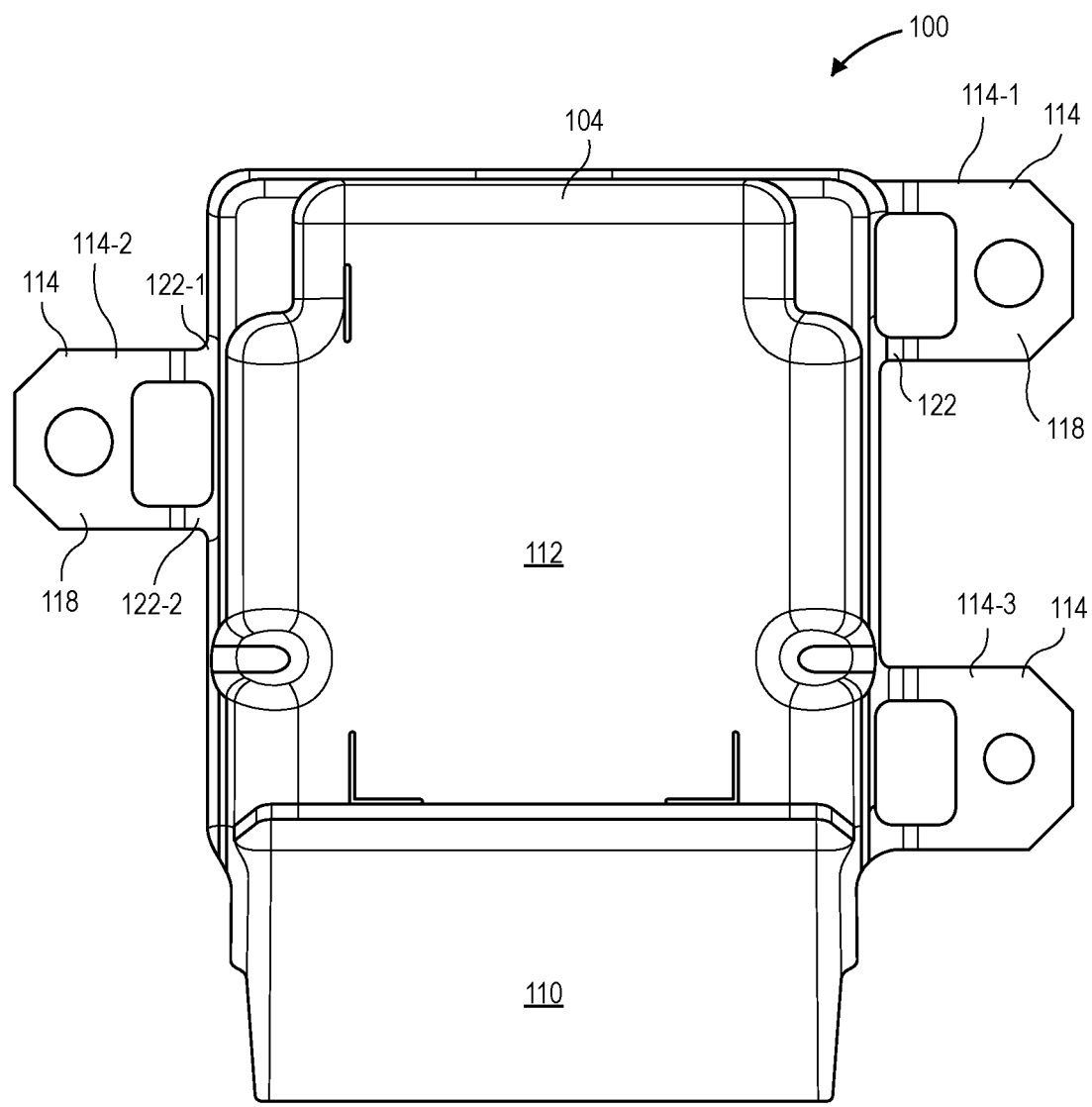
FIG. 2 is a plan view of the housing assembly.
Figure 3:
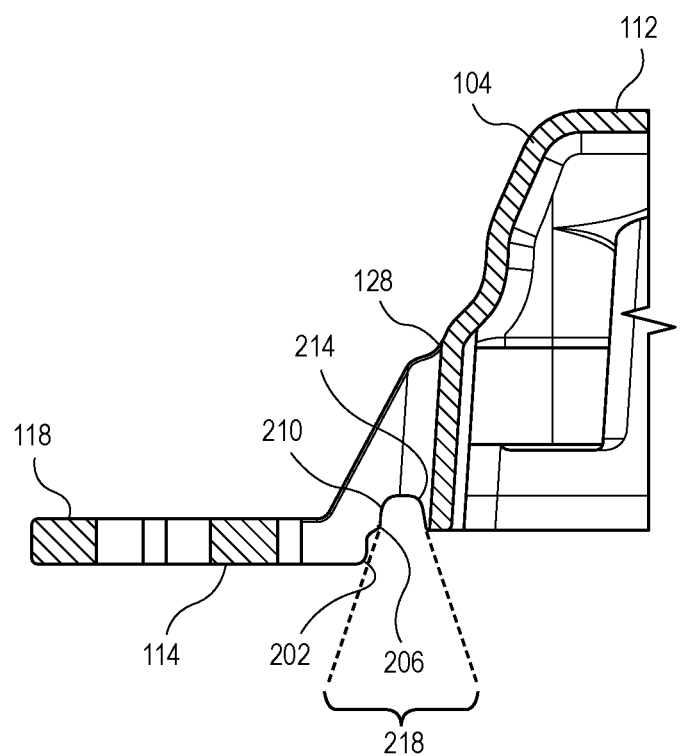
FIG. 3 is a cross-sectional view of a leg member of the housing assembly.

FIGS. 1 through 3 illustrate an exemplary housing assembly 100 that protects an electronic control unit (ECU) 102 via a housing structure 104. For example, in one exemplary arrangement, the ECU 102 may comprise an airbag ECU. The ECU 102 can include a circuit board 106 that is retained within the housing structure 104 of the housing assembly 100. For example, in one exemplary arrangement, the circuit board 106 can be mounted to the housing structure 104 with one or more fasteners.

The housing assembly 100 can also include an electrical connector 108 and an overhang 110. The electrical connector 108 can receive electrical interfaces and provide an electrical connection between various vehicle components and the ECU 102. The overhang 110 can comprise metal, such as aluminum, that extends outwardly from an upper surface 112 of the housing structure 104. The overhang 110 can mitigate exposure of the electrical connector 108 to moisture and/or other foreign particles. In some exemplary implementations, the overhang 110 can be integral with the housing structure 104.

The housing structure 104 serves to mitigate intrusion of moisture and/or foreign particles into the housing assembly 100. The housing structure 104 can comprise diecast metal, such as aluminum, and serves to encapsulate the ECU 102 when positioned within the vehicle.

As shown, the housing structure 104 includes one or more leg members 114. In an exemplary implementation, the housing structure 104 includes leg members 114-1, 114-2, 114-3. As discussed herein, the leg members 114 comprise a geometric configuration that allows the leg members 114 to separate from the housing structure 104 when subjected to a predetermined static load force such that the housing structure 104 and/or ECU 102 remain undamaged due to the static load force. The predetermined static force can be determined via empirical analysis to determine a static force threshold that may cause damage to the housing structure 104 and/or ECU 102 in an event the leg members 114-1, 114-2, 114-3 do not break.

As shown in FIGS. 1 through 3, the leg members 114 can each comprise a foot portion 118 and connecting portions 122-1, 122-2. Each foot portion 118 defines a bore 126 that can receive a fastener for attaching the housing structure 104 within the vehicle. In some implementations, the foot portion 118 may define a fastener or other structure that engages with a corresponding structure. The foot portion 118 can interface with a surface of the vehicle and the connecting portions 122 can interface with a side surface 128 of the housing structure 104. In an exemplary implementation, the leg members 114 are integral with the housing structure 104. For example, the housing structure 104 and the leg members 114 can be constructed through suitable metal casting and/or stamping processes.

With reference to FIG. 3, each leg member 114 can define a first convex portion 202, a second convex portion 206, a first concave portion 210, and a second concave portion 214. The first convex portion 202 is positioned between the foot portion 118 and the connecting portion 122, and the second convex portion 206 is positioned between the first convex portion 202 and a first concave portion 210. The concave portions 210, 214 are positioned proximal to an interface 218 of the housing structure 104 and the connecting portion 122 and distal to the foot portion 118. The convex portions 202, 206 and the concave portions 210, 214 can allow the leg member 114 to separate, or break away, from the housing structure 104 when a predetermined static load force is exerted.

In an exemplary implementation, a radius of the first convex portion 202 is about two (2) times greater than a radius of the second convex portion 206. In other words, the radius of the second convex portion 206 is about one-half (0.5) the radius of the first convex portion 202. A radius of the concave portions 210, 214 can about equal the radius of the first convex portion 212. The geometric parameters of the leg member 114 can comprise a ratio of about 1:0.5:1, i.e., a radius ratio, which represents the ratio of the radius of the convex portion 202 to the radius of the convex portion 206 to the radius of the convex portion 212.

In an exemplary implementation, the radius of the convex portion 202 comprises about one millimeter (1 mm). In this exemplary implementation, the radius of the convex portion 206 comprises about one-half millimeters (0.5 mm), and the radius of the concave portions 210, 214 comprise about one millimeter (1 mm). Referring to FIG. 3, an angle 218 between the concave portions 210, 214 comprises about twenty degrees (20°).

Throughout the present disclosure, the numerical values represent approximate measures or limits to ranges to encompass minor deviations from the given values and embodiments having about the value mentioned as well as those having exactly the value mentioned. The numerical values of parameters in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

It is to be understood that the above description is intended to be illustrative and not restrictive. Many implementations and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments may occur in the arts discussed herein, and that the disclosed systems and methods will be incorporated into such future implementations. In sum, it should be understood that the invention is capable of modification and variation and is limited only by the following claims.

All terms used in the claims are intended to be given their plain and ordinary meanings as understood by those skilled in the art unless an explicit indication to the contrary in made herein. In particular, use of the singular articles such as "a," "the," "said," etc. should be read to recite one or more of the indicated elements unless a claim recites an explicit limitation to the contrary.

What is claimed is:

1. A housing assembly comprising:
   a housing structure;
   a plurality of leg members, wherein at least one leg member of the plurality of leg members comprises a foot portion and at least one connecting portion,
   wherein the at least one leg member defines, extending from a bottom surface thereof, a first convex portion disposed between the foot portion and the at least one connecting portion that interfaces with a side of the housing structure and a second convex portion disposed between the first convex portion and the connecting portion, wherein a radius of the first convex portion is about two times greater than a radius of the second convex portion.

2. The housing assembly as recited in claim 1, further comprising a first concave portion proximal to an interface of the at least one connecting portion and a side surface of the housing structure, wherein a radius ratio of the first convex portion to second convex portion to the concave portion comprises 1:0.5:1.

3. The housing assembly as recited in claim 2, further comprising a second concave portion, wherein an angle between the first concave portion and the second concave portion comprises about twenty degrees.

4. The housing assembly as recited in claim 1, wherein the radius of the first convex portion comprises about one millimeter.

5. The housing assembly as recited in claim 1, wherein the at least one leg member is configured to separate from the housing structure when a predetermined static load force is exerted on the housing assembly.

6. The housing assembly as recited in claim 1, further comprising an electronic control unit, wherein the housing structure is configured to retain the electronic control unit.

7. The housing assembly as recited in claim 6, further comprising an electrical connector that is configured to provide an electrical connection to the electronic control unit.

8. The housing assembly as recited in claim 7, further comprising an overhang that extends outwardly from an upper surface of the housing structure.

9. The housing assembly as recited in claim 8, wherein the overhang is integral with the housing structure.

10. The housing assembly as recited in claim 1, wherein the housing structure comprises die cast metal.

11. The housing assembly as recited in claim 10, wherein the die cast metal comprises aluminum.

12. A housing assembly comprising:
a housing structure;
an electronic control unit disposed within the housing structure;
a plurality of leg members, wherein each leg member of the plurality of leg members comprises a foot portion and a plurality of connecting portions that interface with a side surface of the housing structure, wherein the connecting portions are separated from one another to define a gap therebetween,
wherein each leg member defines a first convex portion disposed between the foot portion and a connecting portion of the plurality of connecting portions and a second convex portion disposed between the first convex portion and the connecting portions, wherein a radius of the first convex portion is about two times greater than a radius of the second convex portion.

13. The housing assembly as recited in claim 12, further comprising a first concave portion proximal to an interface of the connecting portion and a side surface of the housing structure, wherein a radius ratio of the first convex portion to second convex portion to the concave portion comprises 1:0.5:1.

14. The housing assembly as recited in claim 13, further comprising a second concave portion, wherein an angle between the first concave portion and the second concave portion comprises about twenty degrees.

15. The housing assembly as recited in claim 12, wherein the radius of the first convex portion comprises about one millimeter.

16. The housing assembly as recited in claim 12, wherein at least one leg member is configured to separate from the housing structure when a predetermined static load force is exerted on the housing assembly.

17. The housing assembly as recited in claim 16, further comprising an electrical connector that is configured to provide an electrical connection to the electronic control unit.

18. The housing assembly as recited in claim 17, further comprising an overhang that extends outwardly from an upper surface of the housing structure.

19. The housing assembly as recited in claim 18, wherein the overhang is integral with the housing structure.

20. The housing assembly as recited in claim 12, wherein the housing structure comprises diecast metal.

* * * * *